United States Patent [19]

Pfeifer et al.

[11] 4,391,650

[45] Jul. 5, 1983

[54] METHOD FOR FABRICATING IMPROVED COMPLEMENTARY METAL OXIDE SEMICONDUCTOR DEVICES

[75] Inventors: Robert F. Pfeifer; Murray L. Trudel, both of Centerville, Ohio

[73] Assignee: NCR Corporation, Dayton, Ohio

[21] Appl. No.: 218,891

[22] Filed: Dec. 22, 1980

[51] Int. Cl.³ .................... H01L 21/22; H01L 21/265
[52] U.S. Cl. .................................. 148/1.5; 29/571; 29/576 B; 148/187; 357/42; 357/59
[58] Field of Search .................... 148/1.5, 187; 29/571, 29/576 B; 357/59, 42

[56] References Cited

U.S. PATENT DOCUMENTS

| | | | |
|---|---|---|---|
| 3,675,471 | 6/1972 | Klein et al. | 357/42 |
| 4,047,284 | 9/1977 | Spadea | 29/571 |
| 4,063,274 | 12/1977 | Dingwall | 357/53 |
| 4,151,631 | 5/1979 | Klein | 29/571 |
| 4,151,635 | 5/1979 | Kashkooli et al. | 29/571 |
| 4,192,059 | 3/1980 | Khan et al. | 29/571 |
| 4,208,781 | 6/1980 | Rao | 29/576 B |
| 4,212,684 | 7/1980 | Brower | 148/1.5 |
| 4,256,515 | 3/1981 | Miles et al. | 29/571 |
| 4,280,272 | 7/1981 | Egawa et al. | 29/571 |
| 4,295,897 | 10/1981 | Tubbs et al. | 148/1.5 |
| 4,305,760 | 12/1981 | Trudel | 148/1.5 |
| 4,306,915 | 12/1981 | Shiba | 148/1.5 |
| 4,329,186 | 5/1982 | Kotecha et al. | 148/1.5 |

OTHER PUBLICATIONS

Clemens et al., "Impurity Diffusion in SiO₂ Layers and Related Effects . . . ," Electrochem. Society Extended Abstracts, vol. 74-1, p. 125, May 1974.

*Primary Examiner*—Upendra Roy
*Attorney, Agent, or Firm*—J. T. Cavender; Philip A. Dalton; T. Rao Coca

[57] ABSTRACT

Disclosed is a process for a CMOS integrated circuit having polysilicon conductors of a single conductivity, single impurity type. After forming the conductors they are covered by an oxidation and diffusion mask consisting of a dual layer of silicon dioxide and silicon nitride. Then, source and drains of the p-channel and n-channel transistors are formed. Next, an implantation or diffusion barrier is grown over sources and drains. The oxidation and diffusion mask over all the conductors is then removed and they are all doped simultaneously using a single type impurity.

The process may be used to additionally form polysilicon resistors by initially doping the polysilicon to a low level of conductivity. After forming the conductors and resistors they are covered by the oxidation and diffusion mask. Then a resistor mask of either silicon nitride or polysilicon is formed over the resistors to protect them during the high conductivity doping of the conductors.

8 Claims, 17 Drawing Figures

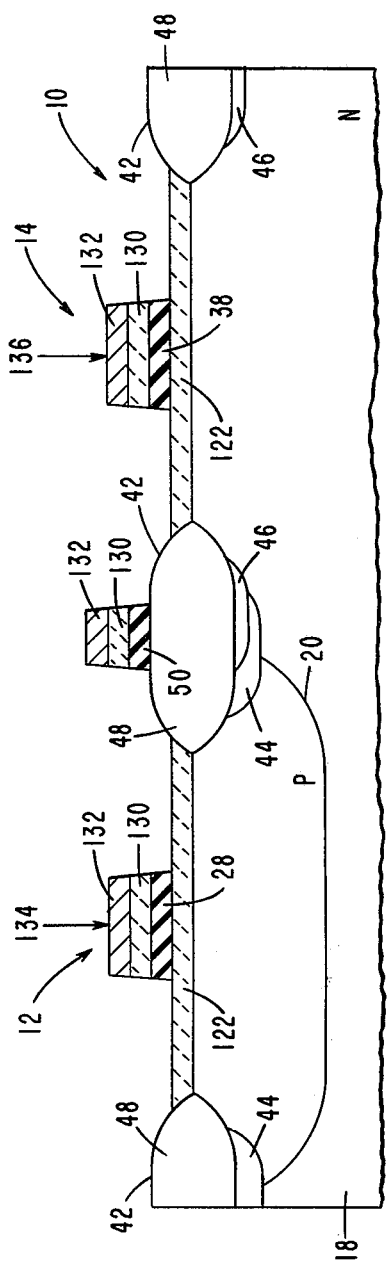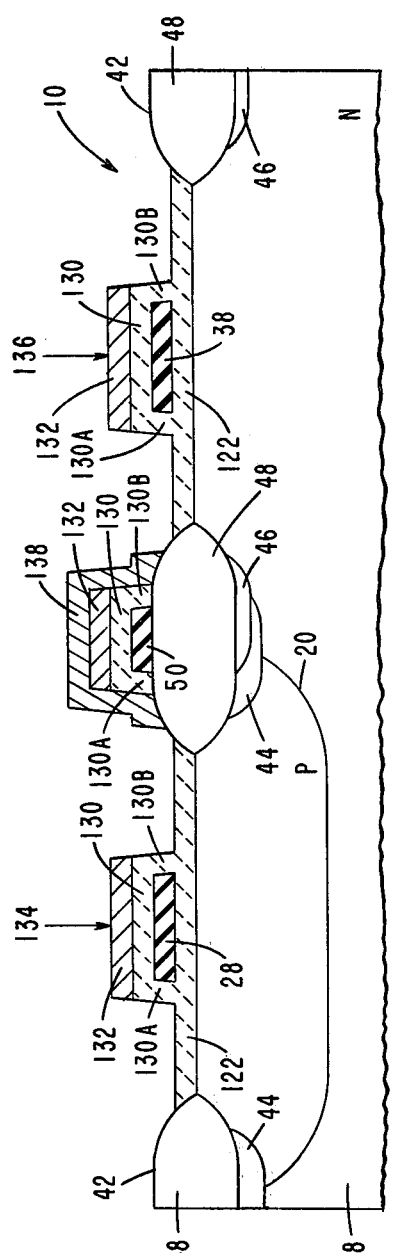
FIG. 2J
FIG. 2K

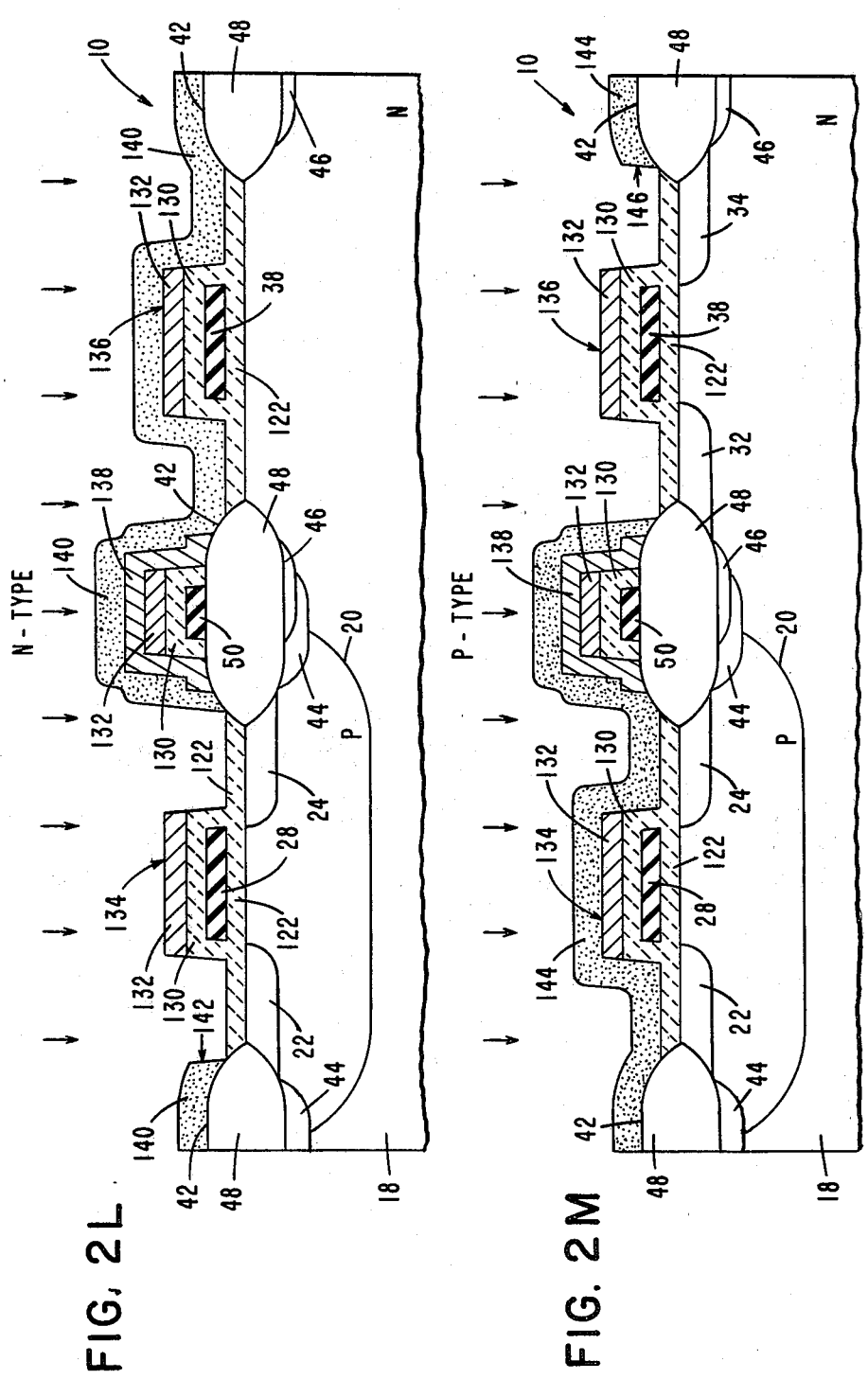

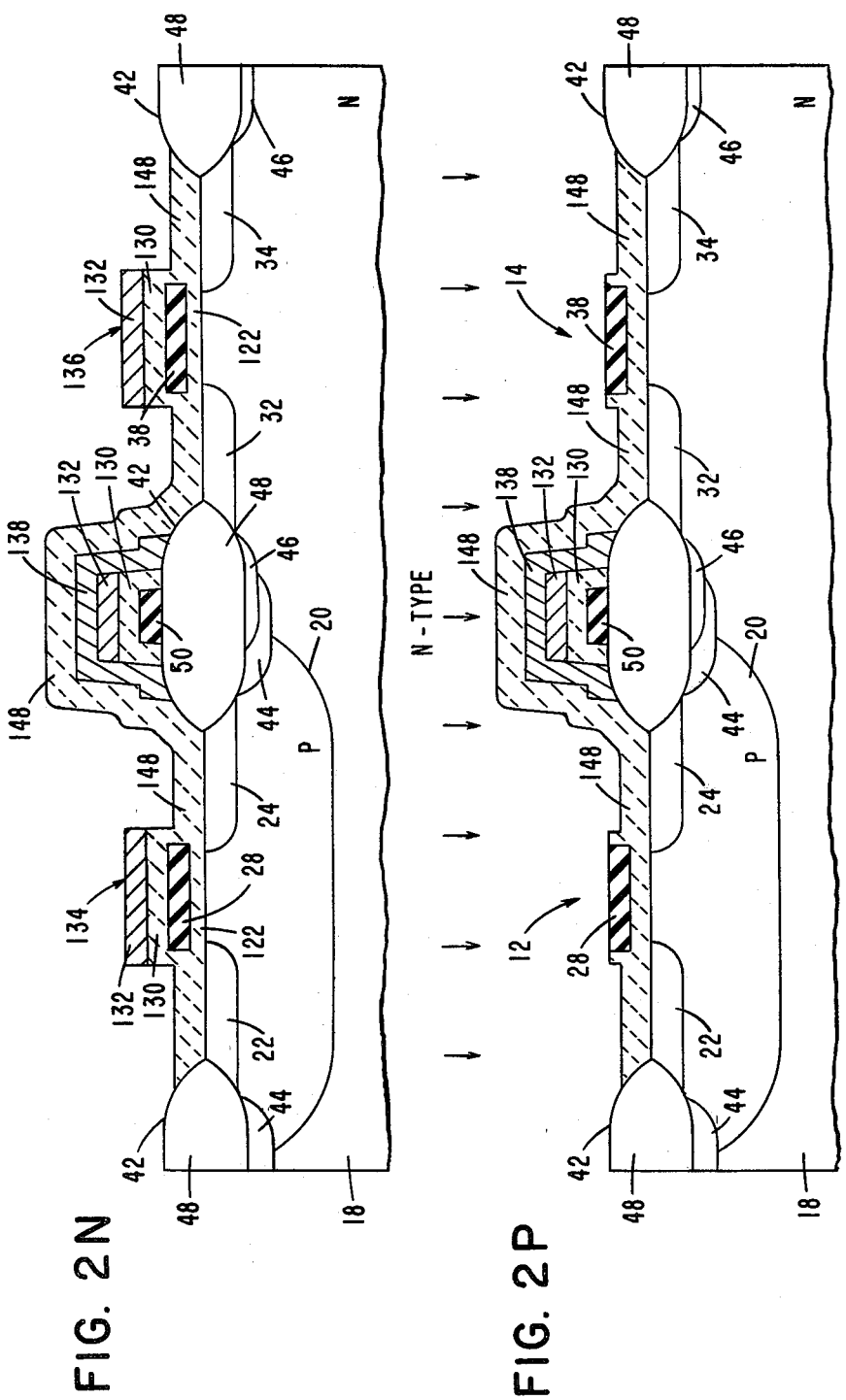

METHOD FOR FABRICATING IMPROVED COMPLEMENTARY METAL OXIDE SEMICONDUCTOR DEVICES

BACKGROUND OF THE INVENTION

This invention relates in general to complementary metal oxide semiconductor (CMOS) devices having gate electrodes and conductors constructed of polysilicon. More particularly, this invention is directed to a process for fabricating such CMOS devices such that the polysilicon gate electrodes and conductors are of a single conductivity, single impurity type.

As used herein, the following definitions apply:

"Impurity type" refers in the conventional sense to n-type (donor) or p-type (acceptor) impurities;

"Conductivity" is used in the conventional sense as being a measure of the ability to conduct current, and is the reciprocal of resistivity;

"Conductivity type", "n-type conductivity" and "p-type conductivity" refer to the dominant impurity-type, n-type or p-type, which a material contains. Thus the conductivity type of a polycrystalline silicon material which is heavily doped with n-type impurities and lightly doped with p-type impurities would be n-type conductivity, while the same material doped solely with p-type impurities would have p-type conductivity.

In the fabrication of CMOS devices, it is preferable to use silicon gate technology rather than metal gate technology. This preference for silicon gate technology arises from several advantages inherent in this type of technology. In particular, the use of silicon gate technology provides an area savings due to the better tolerances arising from the self-aligning nature of such gate structures, due to the ability to provide an additional layer of interconnect and due to the availability of buried contacts.

The earliest silicon-gate fabrication processes produced CMOS devices having polysilicon electrodes and conductors of both n-type and p-type conductivity. This dual conductivity scheme resulted from the dual impurity nature of CMOS devices. In particular, these early fabrication processes were designed to dope a gate electrode of a transistor when the transistor's source and drain regions were formed. In this way, the polysilicon gate electrodes and conductors associated with the p-channel transistors were doped with p-type impurities during formation of the source and drain regions of the p-channel transistors. Similarly, the polysilicon gate electrodes and conductors associated with the n-channel transistors were made to be n-type. Accordingly, CMOS devices fabricated in this manner had some gate electrodes and conductors which were p-type and some gate electrodes and conductors which were n-type. This dual conductivity scheme presents several design and fabrication problems. The most prominent problem associated with devices fabricated in this manner is that a p-type gate electrode and/or conductor cannot be connected directly to an n-type gate electrode and/or conductor. A metal bridge must be interposed between gate electrodes and/or conductors of different conductivity types to provide a good ohmic contact between them. Use of such a metal bridge, however, is highly undesirable because it occupies a significant amount of chip area, which can only be used for this connection function. This problem is aggravated in LSI and VLSI circuits where efficient use of chip area is of the utmost importance. Accordingly, it is highly desirable to fabricate CMOS devices to have gate electrodes and conductors of a single conductivity type to make more efficient use of chip area.

A technique for forming CMOS devices having single conductivity electrodes and conductors is known in the prior art. This technique comprises the steps of heavily doping all of the polysilicon gate electrodes and conductors with n-type impurities (such as phosphorus or arsenic) prior to formation of the source and drain regions. Thereafter, the source and drain regions of the n-type and p-type channel transistors are formed by diffusing or implanting suitable dopants into the substrate. Typically, the n-channel transistors are formed by implanting phosphorus or arsenic into the substrate while the p-channel transistors are formed by implanting boron into the substrate. The formation of the source and drain regions of the p-channel transistors introduces p-type impurities (boron) into the previously n-doped gate electrodes and conductors associated with these transistors. In implementing this technique, the initial, n-type impurity is sufficiently greater than the p-type concentration so that these electrodes and conductors remain n-type even after the p-type impurities have been introduced during the formation of the p-channel transistors. In short, the gate electrodes and conductors associated with the p-channel transistors are doped with two impurities but, because of the n-type overdoping, exhibit the same n-type conductivity as the gate electrodes and conductors associated with the n-channel transistors.

While the above mentioned processing technique achieves the desired result of producing a CMOS device with gate electrodes and conductors of a single conductivity type, the introduction of boron into the gate electrodes and conductors associated with the p-channel transistors during formation of their source and drain regions produces a potential problem when scaled small geometry (i.e. very thin gate insulator) devices are being formed. This problem arises from the propensity of boron to diffuse from the gate electrodes (associated with the p-channel transistors), through the thin oxide layer which separates the gate electrodes from the underlying substrate, and into the underlying substrate, thereby changing the threshold voltage of the p-channel transistors or producing a short between their source and drain regions. In either case, this boron penetration has a detrimental effect upon the operation of the resulting device as fully discussed by J. T. Clemens and E. F. Labuda in their publication entitled "Impurity Diffusion in $SiO_2$ Layers and Related Effects on the MOS Properties of the Si-Gate Technology," Electrochemical Society Extended Abstracts, Vol. 74-1, Abstract No. 46, p. 125, May 1974. Accordingly, this processing technique is unsuitable for the fabrication of silicon-gate VLSI circuits and other CMOS devices having very thin gate oxide p-channel transistors.

It is therefore an object of the present invention to provide a method for forming integrated circuit devices having polysilicon gate electrodes and conductors of a single conductivity, single impurity type, wherein the gate electrodes and conductors are doped independently of the substrate regions such as source and drain regions.

Another object of the present invention is to provide a method for forming CMOS devices having single conductivity gate electrodes and conductors, which method is applicable to CMOS VLSI circuits and other CMOS devices having small geometries.

It is an added object of the present invention to provide a method for the fabrication of CMOS devices having a single layer of polysilicon suitably doped to provide areas of high conductivity for interconnect lines and areas of low conductivity for resistors.

These and other objects of the invention will be apparent from the following description.

SUMMARY OF THE INVENTION

The subject invention comprises an improved processing technique which eliminates the above mentioned problems by producing CMOS devices having polysilicon electrodes and conductors of a single conductivity, single impurity type. The unique aspects of the subject invention are realized by doping the gate electrodes and conductors after, and independently of, the source and drain region. In particular, the subject invention comprises the processing steps of forming the desired pattern of gate electrodes and conductors on a semiconductor substrate such that each of the gate electrodes and conductors overlies a thin layer of gate oxide and is covered by a suitable oxidation and diffusion mask. The oxidation and diffusion mask, which consists of a dual layer of silicon dioxide and silicon nitride, serves as an oxidation mask and an implant or diffusion mask for the gate electrodes and also for the resistors. The source and drain regions of the p-channel and n-channel transistors are alternately masked and formed by diffusing or implanting p-type and n-type impurities into the substrate. A layer of barrier oxide is then thermally grown on the substrate to completely cover the source and drain regions thereby protecting these regions from further doping during subsequent doping of the gate electrodes and conductors. Thereafter, the oxidation and diffusion mask which overlies each of the gate electrodes and conductors is selectively removed (while leaving the source and drain regions covered), thereby exposing the underlying gate electrodes and conductors. The exposed gate electrodes and conductors are then doped using either standard diffusion or implantation techniques.

The processing technique of the present invention provides CMOS devices having polysilicon gate electrodes and conductors of a single conductivity, single impurity type. All of the poly gates and conductors are n+ doped. Because all of the gate electrodes and conductors have the same conductivity and have the same type of impurities, the need for metal bridges between conductors is avoided. Also, because all the gate electrodes are not subjected to p-type dopant, the channel doping problem is eliminated. Accordingly, the processing technique of the present invention can be used to fabricate VLSI circuits and other CMOS devices having small geometries (such as, very thin gate insulators).

The above-described process can be modified to provide CMOS devices with both high and low resistivity polysilicon conductors. To fabricate CMOS devices with high and low resistivity conductors, after the polysilicon is deposited it is initially doped to a low conductivity level. Then, an oxidation and diffusion mask consisting of a dual layer of silicon dioxide and silicon nitride is formed over the polysilicon. Next, the desired pattern of gates and conductor lines is formed. Then a resistor mask of either polysilicon or silicon nitride is formed over the oxidation and diffusion mask and is patterned to cover only those portions of the masked conductors where high resistivity conductors (resistors) are desired. Thereafter, leaving in place the respective masks over the gates and conductors, source and drain regions of the p-channel and n-channel transistors are formed. After the source and drain regions of the p-channel and n-channel transistors have been formed, a layer of barrier oxide is thermally grown onto the substrate to protect the source and drain regions from the second doping of the gate electrodes and conductors. The oxidation and diffusion mask which overlies the gate electrodes and those portions of conductors which are not covered by both the resistor mask and the oxidation and diffusion mask are then selectively removed to expose the gate electrodes and portions of the conductors which are to exhibit low resistivity. The gate electrodes and the exposed portions of the conductors are then doped using either standard diffusion or implantation techniques. In this way, the gate electrodes and exposed portions of the conductors are highly doped to exhibit relatively high conductivity while the unexposed portions of the conductors are only lightly doped to exhibit relatively high resistivity.

DETAILED DESCRIPTION OF THE INVENTION

Figure 1:
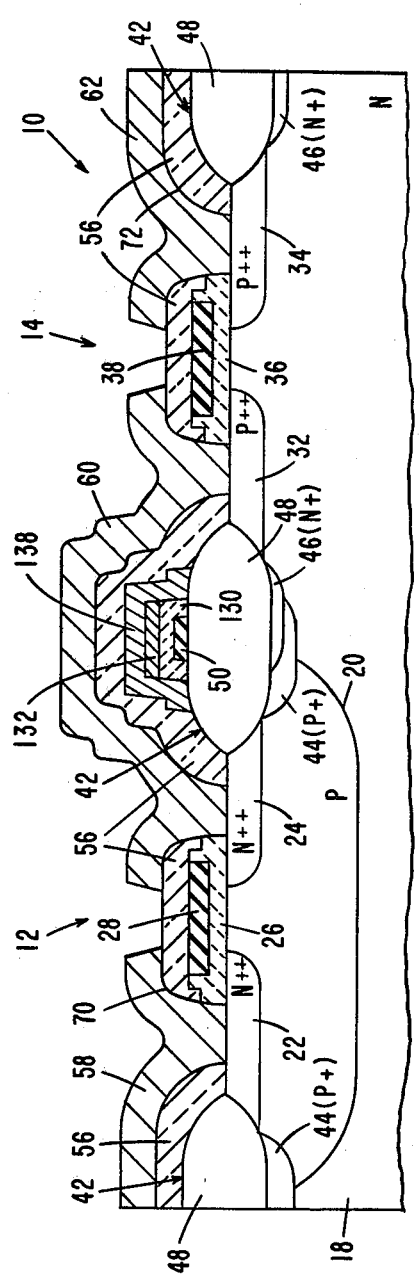
FIG. 1 is a partial sectional view of a CMOS device fabricated according to a process embodying the principles of the present invention.

Referring now to FIG. 1, there is shown in this figure a partial sectional view of a portion of a CMOS device 10 embodying the principles of the present invention. The portion of CMOS device 10 is comprised of an n-channel transistor 12, a p-channel transistor 14 and a high resistivity line 50. While the following description is primarily directed toward the fabrication of these components of the device, the description is exemplary of the fabrication of a class of devices which embody the principles of the present invention. In addition, it should be noted that the thickness and other dimensions shown herein are selected for clarity of illustration and not to be interpreted in a limiting sense. The dimensions can be smaller or larger depending upon the operating environment in which the device is going to be used. In this regard, it should be further pointed out at this time that the thrust of microelectronics technology is toward smaller dimensions to achieve greater device density, better performance, etc.

CMOS device 10 comprises a substrate 18 of one conductivity type, illustratively, n-type silicon. A p-type surface-adjacent impurity region or well 20 is formed in the substrate by diffusing p-type impurities into the substrate.

The n-channel transistor 12 includes a pair of n-type impurity regions which are diffused or implanted into the substrate within the p-well 20 to form the source 22 and drain 24 of the transistor. The transistor 12 also includes a thin layer of gate oxide 26 and a polysilicon gate electrode 28 which overlies the channel region between the source and drain regions of the transistor.

Similarly, the p-channel transistor 14 includes a pair of p-type impurity regions which are the source 34 and drain 32 of the transistor. These impurity regions are formed by implanting or diffusing p-type impurities into the substrate. The p-channel transistor 14 includes a thin layer of gate oxide 36 and a polysilicon gate electrode 38 which overlies the channel region between the source and drain regions of transistor 14.

Channel stops 42 are strategically formed on the substrate 18 to electrically isolate the components of CMOS device 10. One such channel stop is located between the p-channel and n-channel transistors and is hereinafter referred to as the center channel stop. Each of the channel stops is comprised of a $p^+$ impurity region 44, an $n^+$ impurity region 46 and an oxide barrier 48. The impurity regions 44 and 46 serve to increase the field inversion voltage of the device. As mentioned above, the portion of CMOS device 10 which is shown in FIG. 1 also includes a conductor line which is generally designated by the numeral 50. Conductor line 50, which has a high resistivity and serves as a resistor element, is a layer of polysilicon which is formed over the oxide barrier 48 of the center channel stop and initially doped to a low level of conductivity. The top and lateral surfaces of this layer of silicon 50 are in turn encircled by a layer of oxide 130 to (1) protect the sidewalls of polysilicon 50 from being further doped in subsequent steps and (2) avoid direct contact between polysilicon 50 and the silicon nitride 132, to be formed over the polysilicon in a later step, thereby preventing transfer of stresses in the nitride to the polysilicon 50. Overlying the top surface of the silicon oxide layer 130 is a silicon nitride layer 132. The nitride 132 is formed to enable its removal at selected portions of the polysilicon conductor 50 and allow these portions to be independently doped to a high conductivity level. High resistivity conductor 50 is further enclosed by a layer of masking material 138, typically silicon nitride or polysilicon, which completely covers the top surface of silicon nitride layer 132, the lateral surfaces of silicon oxide layer 130 and a portion of the top surface of the oxide barrier 48 of the center channel stop. The layer 138 protects the initially doped low conductivity regions of polysilicon 50 from a subsequent high conductivity doping.

Gate electrode 28, gate electrode 38 and high resistivity conductor 50 are all doped with n-type impurities to provide a CMOS device having gate electrodes and conductors of a single impurity type. It should be further noted that gate electrodes 28 and 38 are doped with the same concentration of impurities to form high conductivity electrical conductors while conductor line 50 is doped with a lower concentration of impurities to provide a resistor element. Accordingly, gate electrodes 28 and 38 are constructed to be of a single conductivity, single impurity type while high resistivity conductor line 50 is constructed to be of the same impurity type but of a lower conductivity. The processing technique used to dope these conductors independently of the substrate impurity regions such as 22, 24, 32 and 34 will be discussed in greater detail hereinafter.

CMOS device 10 is also provided with a thick insulating layer 56 which is appropriately patterned to cover the gate structure of n-channel transistor 12, the gate structure of p-channel transistor 14 and the high resistivity conductor line 50. Insulating layer 56 electrically isolates the polysilicon gates and conductors from the overlying metal conductors 58, 60 and 62. Electrical conductor 58 electrically couples source 22 to associated electrical circuitry (not shown). Metal conductor 60 electrically couples drains 24 and 32 to each other as is typical for CMOS pairs. Finally, metal conductor 62 electrically couples source 34 to associated circuitry (not shown) such as a voltage supply. It should be further noted that those skilled in the art will readily recognize that other insulating materials, passivating materials, and electrical connections and interconnections (not shown herein) may be applied as needed to complete the protection of an integration of the transistors shown in this Figure with other components of the device.

Figure 2A:
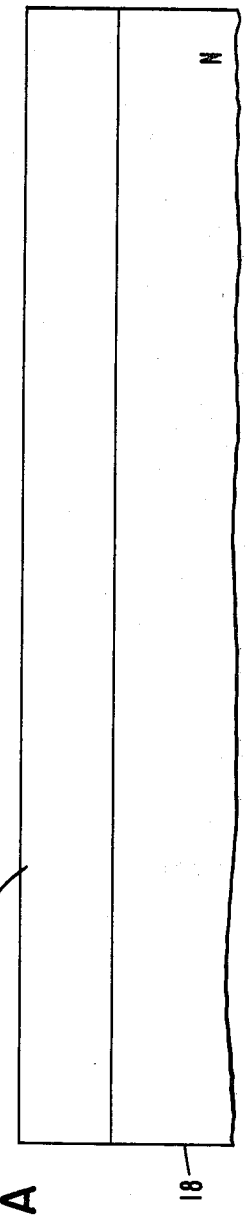
FIGS. 2A–P are flow diagrams illustrating by sequential cross-sectional representation the process of the present invention for forming a CMOS device with polysilicon gate electrodes and conductors of a single conductivity, single impurity type.

Reference is now made to FIGS. 2A-P wherein the successive steps of the fabrication process of the present invention are illustrated in detail. It should be noted that many of the techniques for implementing the various steps of the fabrication method are well known in the art and may be implemented in a number of different ways which are readily apparent to those of ordinary skill in the art.

Figure 2B:
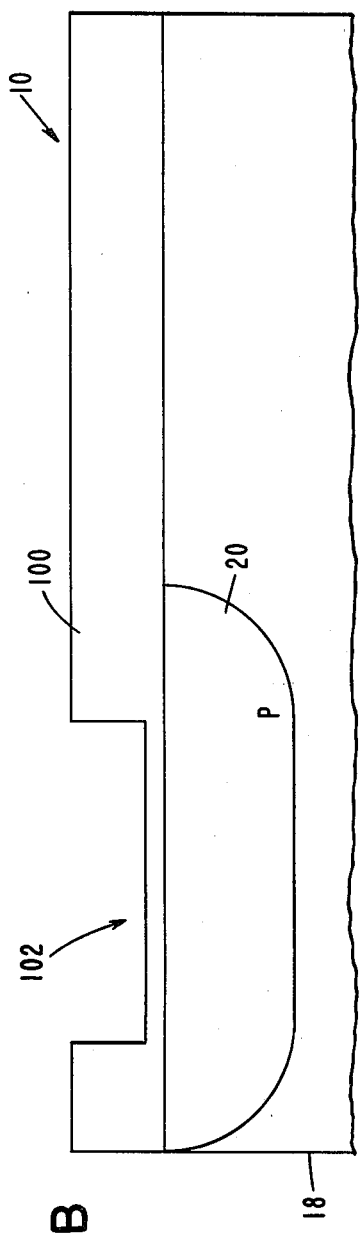

Referring now to FIG. 2A, the fabrication process of the present invention in initiated by growing a layer of oxide 100 over the top surface of an n-type substrate 18 to a thickness of 6000 Angstroms (0.6 microns). As shown in FIG. 2B, oxide layer 100 is then selectively etched using conventional photolithographic techniques to provide a diffusion window 102 at each location of the chip where an impurity well is to be formed. The surface-adjacent p-well 20 is then formed by implanting or diffusing p-type ions (such as boron) into the substrate 18 through the diffusion window 102. If the p-well 20 is formed by the implantation technique, an oxide layer 100 of a thickness of about 1000 Angstroms (0.1 microns) may be left in the window 102. After implantation this oxide layer is etched away by using a conventional etching technique. If the p-well 20 is formed by the diffusion technique, on the other hand, the entire oxide layer in the window region 102 must be removed prior to diffusion. The preferred method of forming the p-well 20 is by implantation as this method enables control over the depth of the well and provides a low surface concentration of impurities for the well region.

Figure 2C:
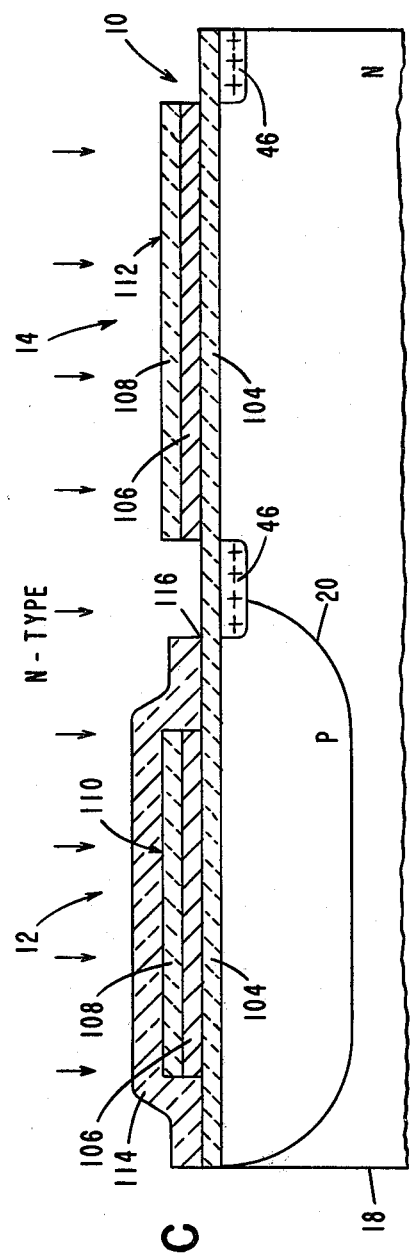

The next step of the fabrication process involves formation of channel stops which define the active regions for the transistors 12 and 14. As mentioned above, each channel stop is comprised of a $p^+$ impurity region 44, an $n^+$ impurity region 46 and an oxide barrier 48. To form the channel stops, initially an oxidation and implantation barrier is formed over the substrate at each location where a transistor device is to be located. These oxidation and implantation barriers are shown in FIG. 2C and are formed by depositing onto the top surface of the substrate a layer of oxide 104 to a thickness of 400-600 Angstroms, a layer of nitride 106 to a thickness of 600-1200 Angstroms, and a second layer of oxide 108 to a thickness of 1200-1600 Angstroms. These three layers 104, 106 and 108 are then patterned using conventional photolithographic techniques to provide an oxidation and implantation barrier at each location of the substrate where a transistor is to be located. The second oxide layer 108 serves to delineate the nitride layer 106 using a wet nitride etch process. In addition, the layer 108 in combination with layer 106 masks the transistor active regions during the subsequent channel stop implantation step. Two oxidation and implantation barriers are shown in FIG. 2C where they are generally designated by the numeral 110 and 112. Oxidation and implantation barrier 110 corresponds to n-channel transistor 12 and is positioned to overlie the active region of this transistor. The second oxidation and implantation barrier 112 corresponds to p-channel transistor 14 and defines the active region of this transistor.

After the oxidation and implantation barriers are formed, a mask 114 is formed over the oxidation and implantation barrier 110 and all of the n-channel active regions 12 to define the n+-impurity regions 46 as shown in FIG. 2C. This mask is formed by depositing a layer of photoresist over the top surface of the semiconductor body such that the layer of photoresist completely covers the exposed portions of the barriers. Then, using conventional photolithographic techniques, the layer of photoresist is patterned to provide the desired mask configuration 114. Mask 114 and the oxidation and implantation barrier 112 control formation of the n-type impurity regions 46 of the channel stops. As shown in FIG. 2C, mask 114 is arranged to have a peripheral boundary 116 which is located between the active region of the n-channel transistor 12 defined by the oxidation and implantation barrier 110, and the surface adjacent boundary of p-well 20. N-type ions are then implanted into the substrate in the presence of the photoresist mask to form the n-type impurity regions 46 of the channel stops. The photoresist mask 114 is then removed.

Figure 2D:
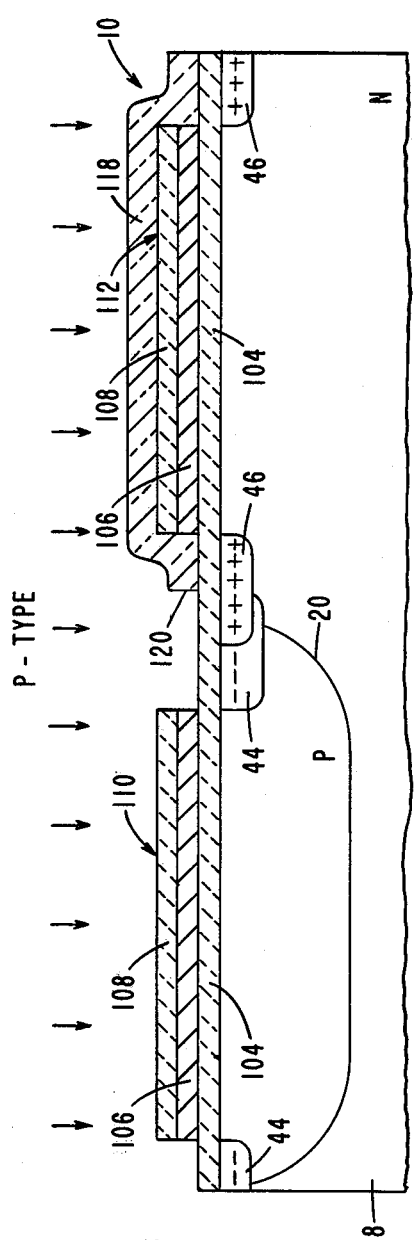

A mask 118 is then formed over the oxidation and implantation barrier 112 and all of the p-channel transistor active regions 14 to define the p+-impurity regions 44 as shown in FIG. 2D. This mask is formed by depositing a layer of photoresist over the top surface of the semiconductor body such that the layer of photoresist completely covers the exposed portions of the semiconductor body and the oxidation and implantation barriers. Then, using conventional photolithographic techniques, the layer of photoresist is patterned to provide the desired mask configuration 118. Mask 118 and the oxidation and implantation barrier 110 control formation of the p-type impurity regions 44 of the channel stops. As shown in FIG. 2D, mask 118 is arranged to have a peripheral boundary 120 which is spaced apart from the active region of the n-channel transistor defined by oxidation and implantation barrier 112 and the surface adjacent boundary of p-well 20. P-type impurities are then implanted into the substrate to provide the p-type impurity regions 44 of the channel stops. See FIG. 2D.

Figure 2E:
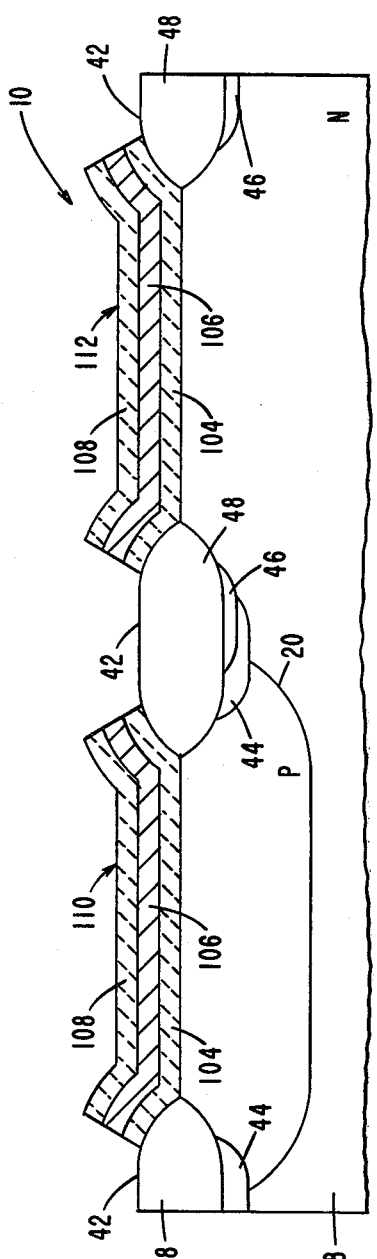

Once the p+-impurity regions 44 have been formed as described above, mask 118 is removed using conventional techniques. Thereafter, the oxide barrier 48 of the channel stops is thermally grown to a thickness of 8,000–16,000 Angstroms (0.8–1.6 microns). Formation of the oxide barrier layers 48 leaves the structure shown in FIG. 2E.

Figure 2F:
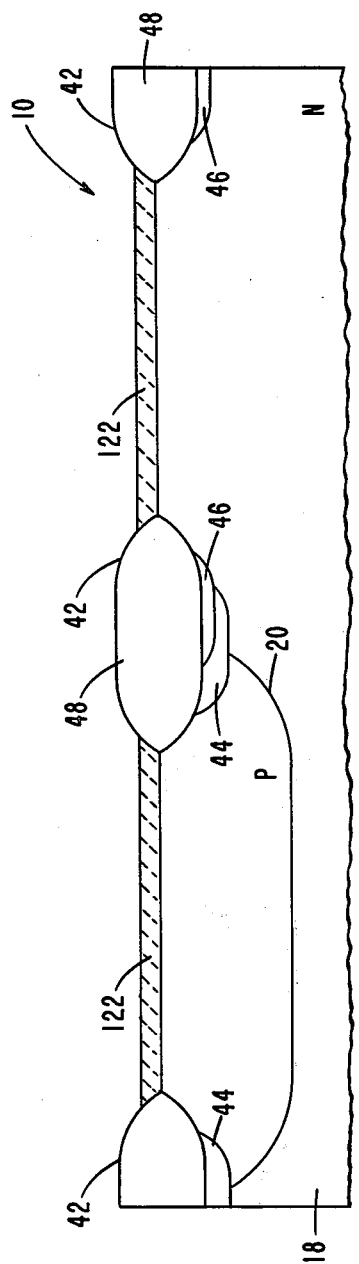

The next steps of the fabrication process are shown in FIG. 2F and comprise removing the oxidation and implantation barrier (by etching away oxide layers 104 and 108 and nitride layer 106), then growing gate oxide 122. It should be noted that the previously-formed oxide barriers 48 are very thick and remain after the removal of the relatively thin oxide layers 104 and 108. Conventional processing techniques are then used to grow a layer of gate oxide 122 on the top surface of the substrate to a thickness of 400 to 700 Angstroms (0.04–0.07 microns). A preferred technique is dry thermal oxidation as this produces dense and high quality oxide layers.

Figure 2G:
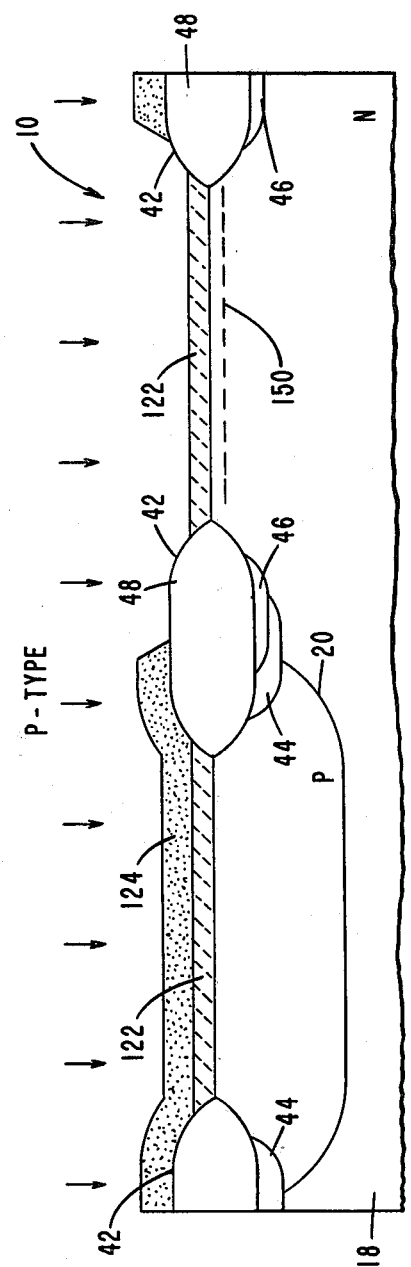

The threshold values of the p-channel and n-channel transistors are then matched by forming surface charge layers of the appropriate conductivity-type at the interface between the substrate and gate oxide layer at each location where a p-channel and/or n-channel transistor is located. Formation of the p-channel surface charge layers is accomplished, as shown in FIG. 2G, by initially forming a photoresist mask 124 which covers the active region of each of the n-channel transistors. Thereafter, p-type dopant ions are implanted into the exposed surface areas of the substrate to form a surface charge layer 150 at the interface between the top surface of the substrate and the layer of gate oxide 122. The surface charge layer adjusts the threshold voltage of the p-channel transistors to the desired level. Mask 124 is then removed using conventional techniques.

Figure 2H:
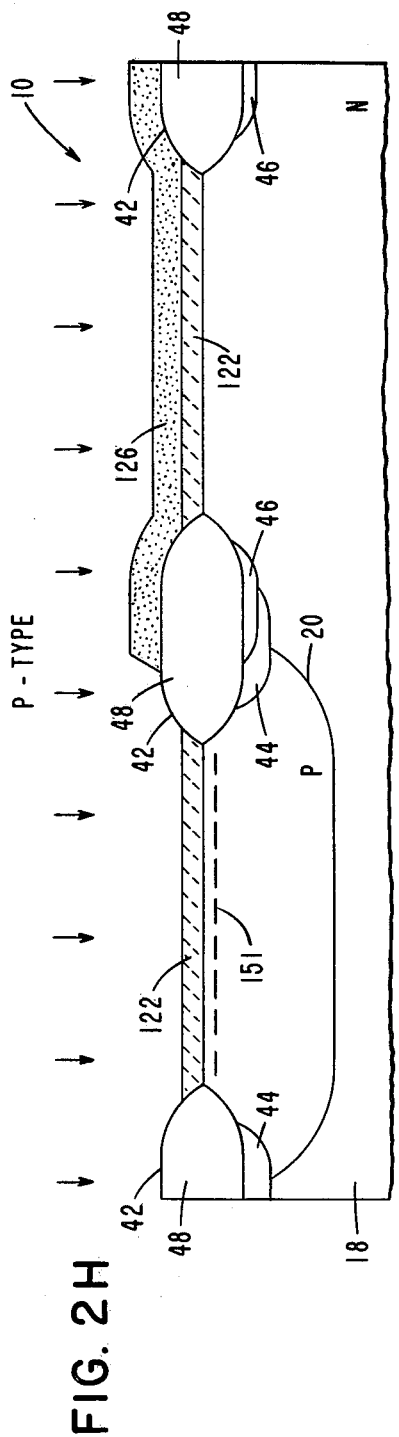

Referring to FIG. 2H, formation of the n-channel surface charge layer is done by forming a photoresist mask 126 which covers the active areas of the p-channel transistors, then implanting p-type ions into the exposed n-transistor active areas of the substrate to form a surface charge layer 151 of p-type impurities at the interface between the surface of the semiconductor substrate and the layer of gate oxide thereon. Mask 126 is thereafter removed using conventional techniques.

Figure 2I:
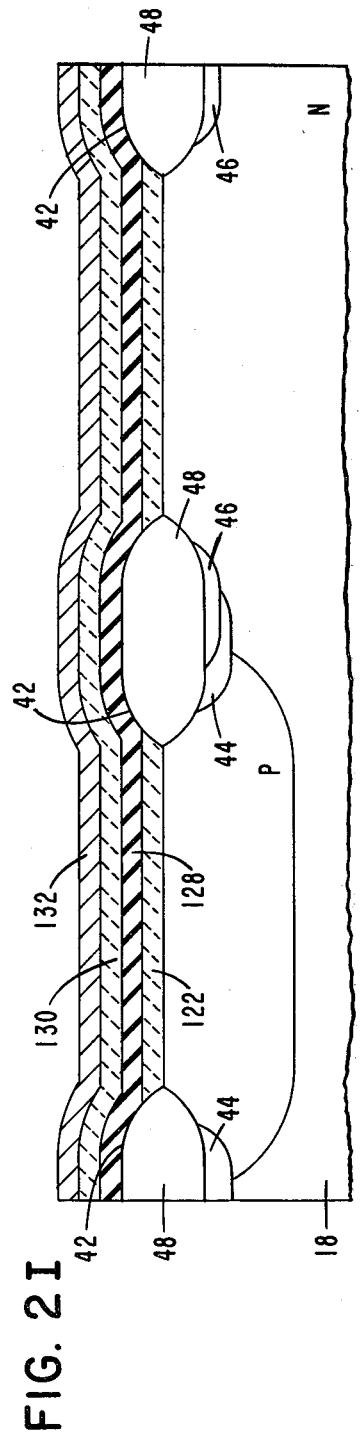

The gate electrodes and conductors are formed during the next step of the fabrication process. A layer of polycrystalline silicon 128 (polysilicon) is deposited onto the semiconductor substrate to a typical thickness of 5000 Angstroms (0.5 microns) (FIG. 2I). The polysilicon 128 is then doped using n-type ions. The amount of doping is determined by the value of conductance (or resistance) desirable for the polysilicon conductor line (or resistor) 50 to be formed from the polysilicon layer 128 in a subsequent step. Then, using conventional techniques, the upper surface of the layer of polysilicon 128 is converted into a layer of silicon oxide 130 by thermal oxidation or a layer of silicon oxide 130 is deposited onto the upper surface of the polysilicon layer, to a thickness of 400–500 Angstroms (0.04–0.05 microns). A layer of silicon nitride 132 is then formed over the layer of silicon oxide 130 using conventional processing techniques such as chemical vapor deposition using a silicon containing gas and ammonia reactants. This layer of nitride is shown in FIG. 2I and is typically 1200–1500 Angstroms (0.12–0.15 microns) thick. The dual layer of oxide and nitride 130–132, which is also referred to herein as the oxidation and diffusion mask, serves a multiple purpose. First, it serves as an oxidation mask. Second, it serves as an implantation or diffusion mask during the n-channel and p-channel source and drain formation. Third, the oxidation and diffusion mask lends itself for selective removal after forming the source and drain barrier oxide to expose the underlying polysilicon for a high conductivity doping, as explained below.

Referring to FIG. 2J, conventional photolithographic techniques are then used to pattern nitride layer 132, silicon oxide layer 130 and polysilicon layer 128 into the desired combination of conductors and gate structures. Two such gate structures and one such conductor line are shon in FIG. 2J: gate structures 134 and 136 are for n-channel transistor 12 and p-channel transistor 14, respectively; conductor line 50 is formed on top of the oxide barrier 48 of the center channel stop.

Once these gate structures and conductors have been formed, a short oxidation cycle is used to cap the exposed side portions of the polysilicon gates and conductors thereby protecting these portions from penetration of impurities during subsequent doping steps. This oxidation cycle forms side extensions 130A and 130B to layer 130 so that oxide layer 130 completely covers the polysilicon layer of each gate electrode and conductor. The resulting structure is shown in FIG. 2K. Thereafter, a layer of material such as silicon nitride or polysilicon is deposited over the entire structure and is patterned by conventional photolithographic techniques, forming a mask over those regions, such as conductor line 50, where low conductivity conductors (resistors) are desired. One such resistor masking layer is shown in FIG. 2K where it is designated by the numeral 138. The resistor mask 138 protects the previously doped polysilicon conductor line 50 from further doping during the high conductivity doping of the polysilicon gates and conductors. Typical thickness range of nitride mask 138 is 1200–1500 Angstroms (0.12–0.15 microns). If the mask 138 is polysilicon, the thickness is typically 2000–4000 Angstroms, (0.2–0.4 microns).

The next step of the process, shown in FIG. 2L, is the formation of the source and drain regions of the n-channel transistors. An exemplary technique for forming this step of the process involves depositing a layer of photoresist 140 onto the substrate such that it uniformly covers the previously formed gate structures and conductor structures, then exposing and developing the photoresist to provide a window corresponding to the active region of each n-channel transistor. Such a window 142 is shown in FIG. 2L. Thereafter, referring to FIG. 2L, the source 22 and drain 24 of the n-channel transistors are formed by implanting n-type impurities through the window 142. In performing this implantation step, the gate structure 134 associated with each n-channel transistor acts as a mask which serves to align the transistor's source and drain regions with the gate electrode.

The source and drain regions of the p-channel transistors are then formed as shown in FIG. 2M. As shown in FIG. 2M, conventional photolithographic techniques are used to provide a mask 144 having a window 146 corresponding to the active region of each p-channel transistor. P-type impurity ions are then implanted through the windows 146 to form the source 34 and drain 32 regions of the p-channel transistors. As with the n-channel transistors, the gate structure 136 acts as a further mask which serves to properly align the gate structure with its associated source and drain regions.

Referring now to FIG. 2N, the mask 144 is removed and the oxide layer 122 overlying the source and drain regions is increased to a thickness of 2000–2500 Angstroms (0.2–0.25 microns) to form an implantation barrier to isolate the source and drain regions from subsequent doping of the gate electrodes and the high conductivity conductors. This step is performed by thermal oxidation of the previously formed gate oxide 122 to provide a thicker layer of oxide 148 over the source and drain regions of p-channel and n-channel transistors. It will be appreciated that during this oxidation step the oxide layer 148 is also formed over the resistor mask 138 when the mask 138 is polysilicon. When mask 138 is silicon nitride the oxide barrier layer 148 is formed only over the source and drain regions of transistors 12 and 14.

After this thick layer of oxide 148 has been formed over the source and drain regions, the substrate is selectively etched by using conventional photomasking techniques to remove nitride layer 132 and silicon oxide layer 130 (the oxidation and diffusion mask) from the top of each gate structure and high conductivity conductor(s), thereby exposing the polysilicon layer of these gate structures and conductors. Referring now to FIG. 2P, the above-mentioned etching operation causes the polysilicon gate electrode layer 28 and 38 of the gate structures of the p-channel and n-channel transistors 14 and 12 respectively to be exposed. It should be noted, however, that the resistor masking layer 138 (or 138–148 when 138 is silicon) overlying the resistor 50 is not removed when 138 is polysilicon and only partially removed when 138 is silicon nitride because mask 138 is used to prevent this resistor from being doped simultaneously with the gate electrodes. Thereafter, the exposed polysilicon gate electrodes 28 and 38 and other conductors (except 50, which is a resistor) are doped to a high conductivity using n-type impurities and conventional diffusion or ion implantation techniques.

Typically, the polysilicon conductors and gate electrodes are doped to a high conductivity level such that their sheet resistance is less than about 100 ohms per square, typically 30 ohms per square. This is accomplished when using ion implantation techniques, for example, by means of phosphorus ions of energy 80 kev and a dose of $6 \times 10^{15}$ ions/square cm.

By forming the oxide layer 148 to a thickness of 2000–2500 Angstroms (0.2–0.25 microns), the source and drain regions of the p-channel and n-channel transistors are protected during this doping step and, as a result, are not affected by it. Accordingly, the process of the subject invention dopes the source and drain regions independently of the gate electrodes and the high conductivity conductors. In addition, the process of the subject invention permits all of the gate electrodes and high conductivity conductors to be doped simultaneously to provide gate electrodes and conductors of a single conductivity, single impurity type.

Referring to FIG. 1, after the gate electrodes and conductors have been doped as described above, a thick layer of insulator 56 is deposited over the device, contact cuts such as 70, 72 are made, and a layer of metal is deposited over the substrate and patterned using conventional photolithographic techniques to form metal conductors 58, 60 and 62. After metallization, a passivation coating of material such as phosphosilicate glass (not shown) may be formed over the device.

From the foregoing, it can be seen that the present process is well adapted to attain all of the objects set forth hereinabove. Doping the poly gates and conductors in the manner described yields not only a CMOS VLSI circuit with all n+-doped polygates and interconnect lines which may be connected together without the need for an area consuming metal bridge, but also eliminates the channel doping problems associated with the p-channel transistors. In addition, this process has a feature of formation of selected portions of the interconnect lines into resistor elements by subjecting them to different doping levels.

While the invention has been particularly shown and described with reference to preferred embodiments thereof, it will be understood by those skilled in the art that various changes in form and detail may be made therein without departing from the spirit and scope of the invention.

We claim:

1. A process for forming a high packing density CMOS integrated circuit device from a structure including a body of a semiconductor material having a first active region of a first conductivity type, a second active region of a second conductivity type, and a thin silicon dioxide layer formed on said body encompassing a gate region within each of said active regions, said process comprising the steps of:

forming a layer of polysilicon over said thin silicon dioxide layer;

patterning said polysilicon into gate electrodes corresponding to said first and second active regions;

doping the substrate independently of said gate electrodes to form the source and drain of a first conductivity type in said second active region and a source and drain of the second conductivity type in said first active region such that said sources and drains are aligned with their corresponding gates;

doping said polysilicon gates with impurities of a single conductivity type independently of said sources and drains whereby said device is free of dopant penetration from said gates into said substrate through said thin oxide layer.

2. The process as recited in claim 1 wherein the step of patterning the polysilicon into gate electrodes comprises the steps of:

forming a silicon dioxide-silicon nitride dual mask over the polysilicon layer defining the gate electrodes therein; and forming the layer of polysilicon in the presence of the dual mask into gate electrodes.

3. The process as recited in claim 1 further comprising the steps of:

before patterning the polysilicon layer into gates doping said polysilicon layer with impurities of a single conductivity type to a low level of conductivity;

forming a silicon dioxide-silicon nitride mask over the polysilicon layer defining gate electrodes and resistors therein;

patterning the polysilicon in the presence of the oxide-nitride mask into resistors simultaneously with the patterning of the polysilicon into gate electrodes; and forming a mask over the resistors for protecting said resistors during doping of the gate electrodes.

4. The process as recited in claim 2 wherein doping said gates comprises the steps of:

forming a relatively thick silicon dioxide implantation barrier over the sources and drains to protect said sources and drains from further doping;

removing said dual mask over each gate electrode; and implanting impurities of a single conductivity into the exposed polysilicon layer of said gate electrodes.

5. The process as recited in claim 3 wherein the mask over the resistors is a layer of either polysilicon or silicon nitride.

6. A process for forming a high packing density CMOS integrated circuit from a structure comprising a body of semiconductor material having a first active region and a second active region, respectively, with a p-well formed in the first active region and a 400–700 Angstroms thin silicon dioxide layer formed over said active regions, said process comprising the following steps essentially in the sequence set forth:

forming a polysilicon layer over the silicon dioxide layers and over the body of the semiconductor material;

doping said polysilicon layer with n-type impurities to a relatively low level of conductivity suitable for forming therefrom polysilicon resistors;

forming an oxidation and implantation mask over the polysilicon layer;

patterning the polysilicon layer by using the oxidation and implantation mask into polysilicon gate structures corresponding to the first and second active regions, polysilicon conductor structures and polysilicon resistor structures;

covering the side surfaces of said gate structures, conductor structures and resistor structures with a layer of silicon dioxide;

forming a mask over said polysilicon resistor structures;

implanting n-type and p-type impurities in source and drain regions defined in the first and second active regions, respectively, by the respective polysilicon gate structures;

thermally oxidizing the substrate forming a relatively thick silicon dioxide implantation barrier over the source and drain regions in said first and second active regions;

removing said oxidation and implantation mask over the polysilicon gate structures and polysilicon conductor structures to form polysilicon gates and polysilicon conductors respectively;

simultaneously implanting the polysilicon gates and polysilicon conductors with n-type impurities to a relatively high level of conductivity whereby is created a CMOS device free of dopant penetration from said gates into said substrate via said thin oxide.

7. The process as recited in claim 6 wherein the oxidation and implantation mask over the polysilicon comprises a layer of silicon dioxide and a layer of silicon nitride.

8. The process as recited in claim 7 wherein the mask over the resistor structures is a layer of either polysilicon or silicon nitride.

* * * * *